United States Patent
Pillarisetty et al.

(10) Patent No.: US 9,653,680 B2
(45) Date of Patent: May 16, 2017

(54) TECHNIQUES FOR FILAMENT LOCALIZATION, EDGE EFFECT REDUCTION, AND FORMING/SWITCHING VOLTAGE REDUCTION IN RRAM DEVICES

(71) Applicant: Intel Corporation, Santa Clara, CA (US)

(72) Inventors: Ravi Pillarisetty, Portland, OR (US); Prashant Majhi, Austin, TX (US); Uday Shah, Portland, OR (US); Niloy Mukherjee, Beaverton, OR (US); Elijah V. Karpov, Santa Clara, CA (US); Brian S. Doyle, Portland, OR (US); Robert S. Chau, Beaverton, OR (US)

(73) Assignee: INTEL CORPORATION, Santa Clara, CA (US)

( * ) Notice: Subject to any disclaimer, the term of this patent is extended or adjusted under 35 U.S.C. 154(b) by 0 days.

(21) Appl. No.: 14/752,934

(22) Filed: Jun. 27, 2015

(65) Prior Publication Data

US 2016/0380191 A1 Dec. 29, 2016

(51) Int. Cl.
*H01L 45/00* (2006.01)

(52) U.S. Cl.
CPC ........ *H01L 45/122* (2013.01); *H01L 45/1253* (2013.01); *H01L 45/146* (2013.01); *H01L 45/1675* (2013.01)

(58) Field of Classification Search
CPC . H01L 45/122; H01L 45/1253; H01L 45/146; H01L 45/1666; H01L 45/1675
See application file for complete search history.

(56) References Cited

U.S. PATENT DOCUMENTS

| | | | |
|---|---|---|---|
| 8,114,715 B2 * | 2/2012 | Lee | H01L 45/1233 438/128 |
| 9,520,561 B1 * | 12/2016 | Kim | H01L 45/1233 |
| 2008/0142984 A1 * | 6/2008 | Chen | H01L 45/1233 257/773 |

* cited by examiner

*Primary Examiner* — Cuong Q Nguyen

(74) *Attorney, Agent, or Firm* — The Law Office of Herbert T. Patty, P.C.

(57) ABSTRACT

The present disclosure provides a system and method for forming a resistive random access memory (RRAM) device. A RRAM device consistent with the present disclosure includes a substrate and a first electrode disposed thereon. The RRAM device includes a second electrode disposed over the first electrode and a RRAM dielectric layer disposed between the first electrode and the second electrode. The RRAM dielectric layer has a recess at a top center portion at the interface between the second electrode and the RRAM dielectric layer.

6 Claims, 7 Drawing Sheets

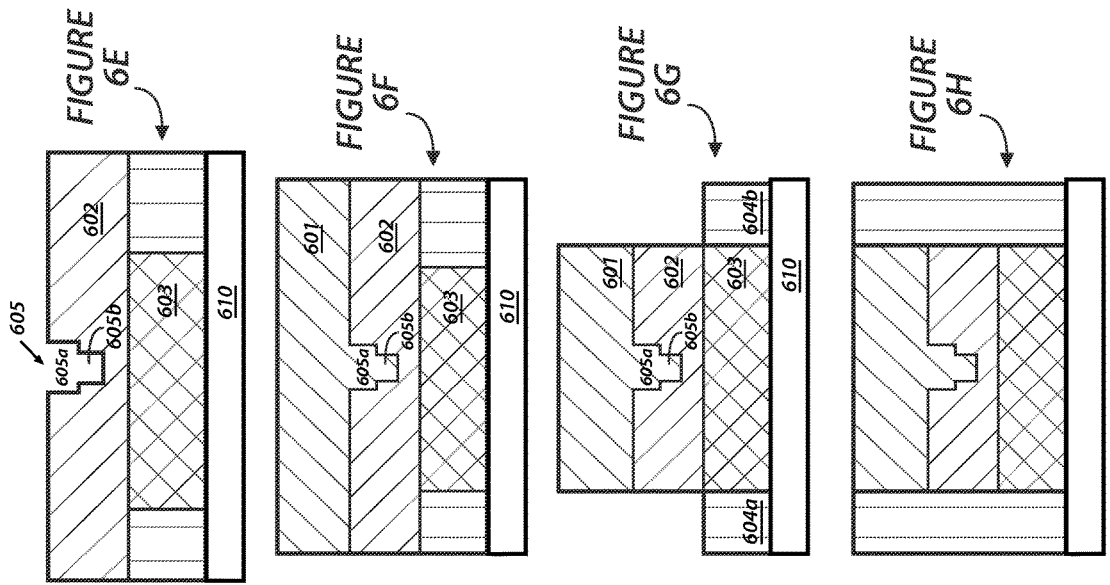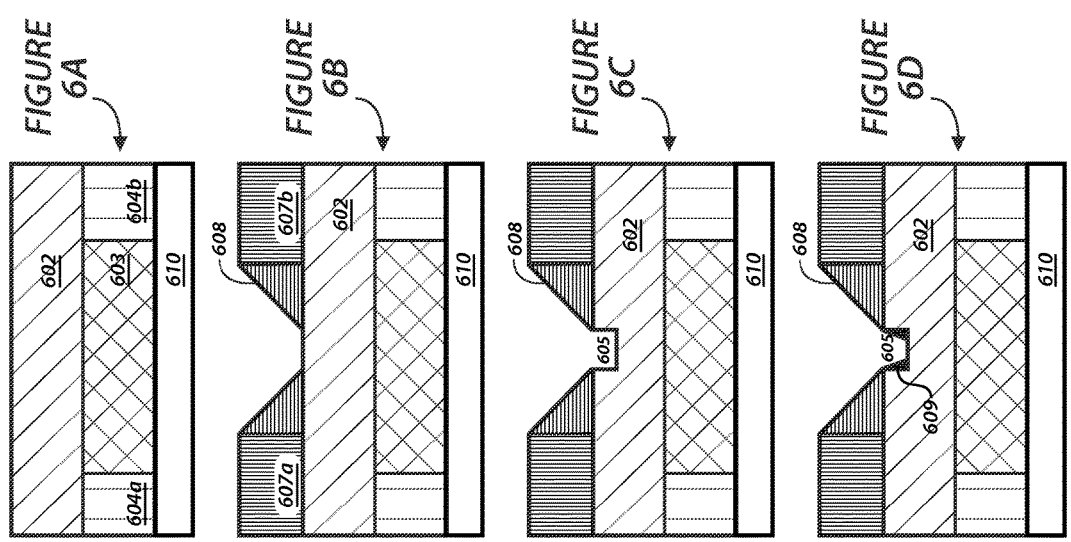

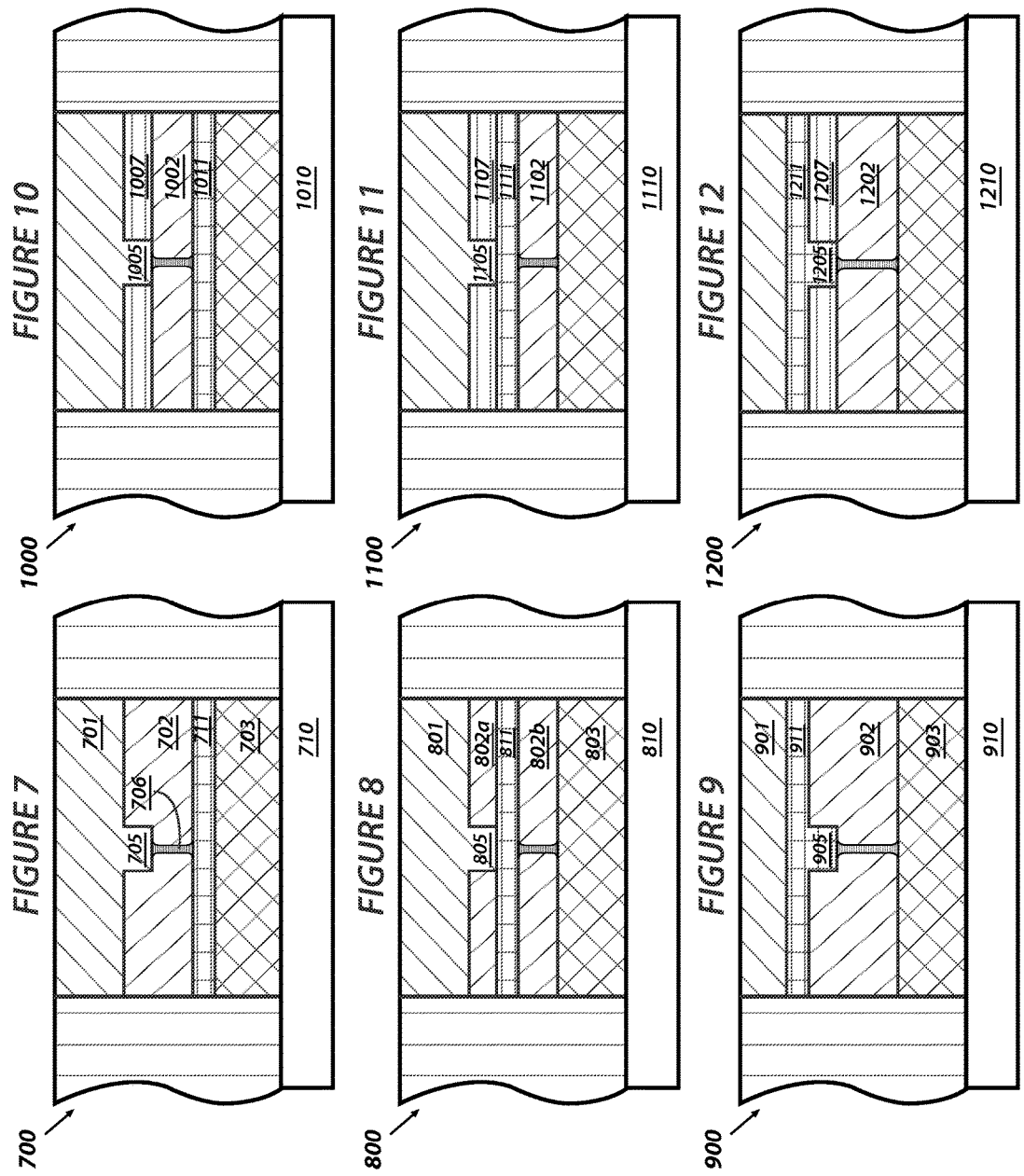

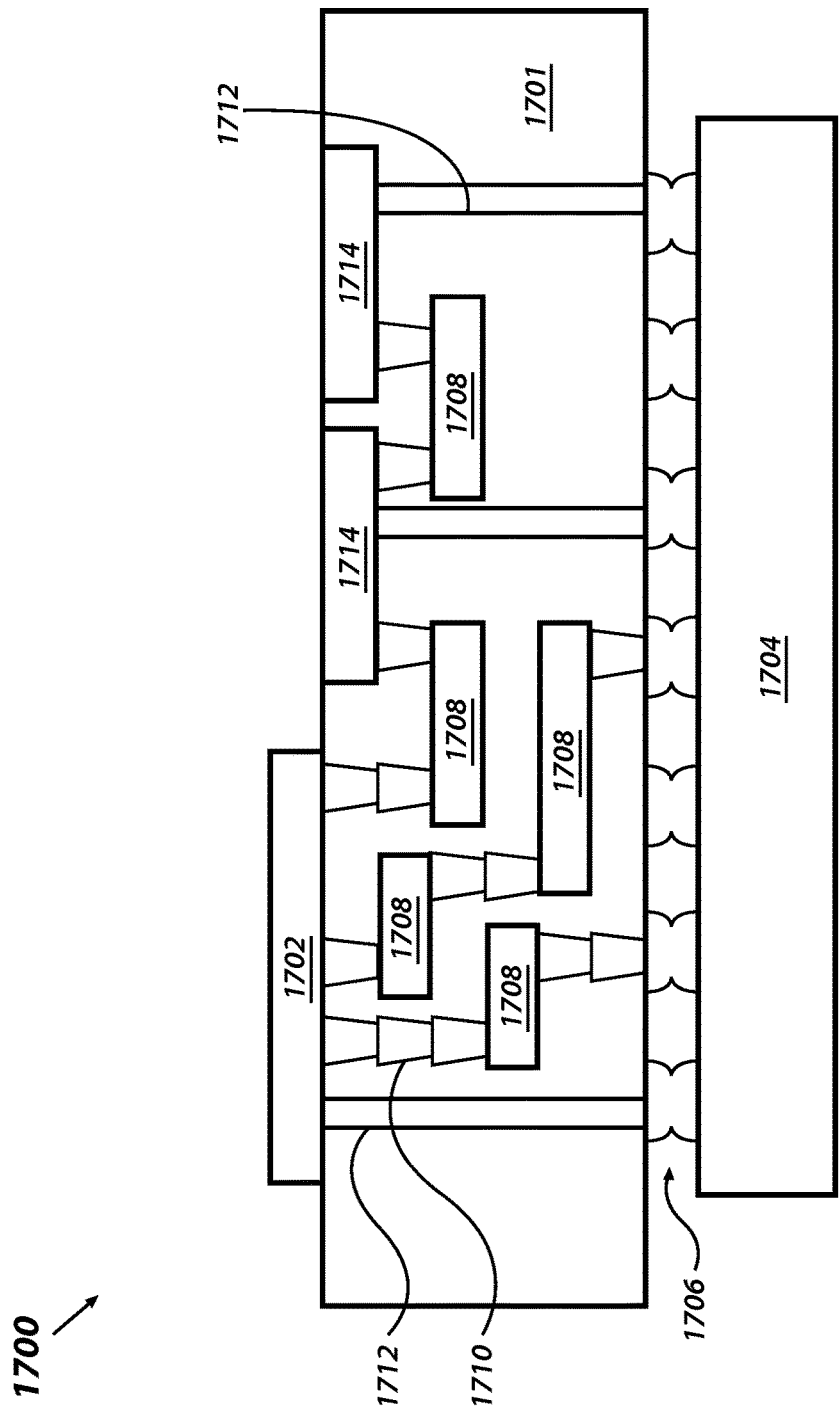

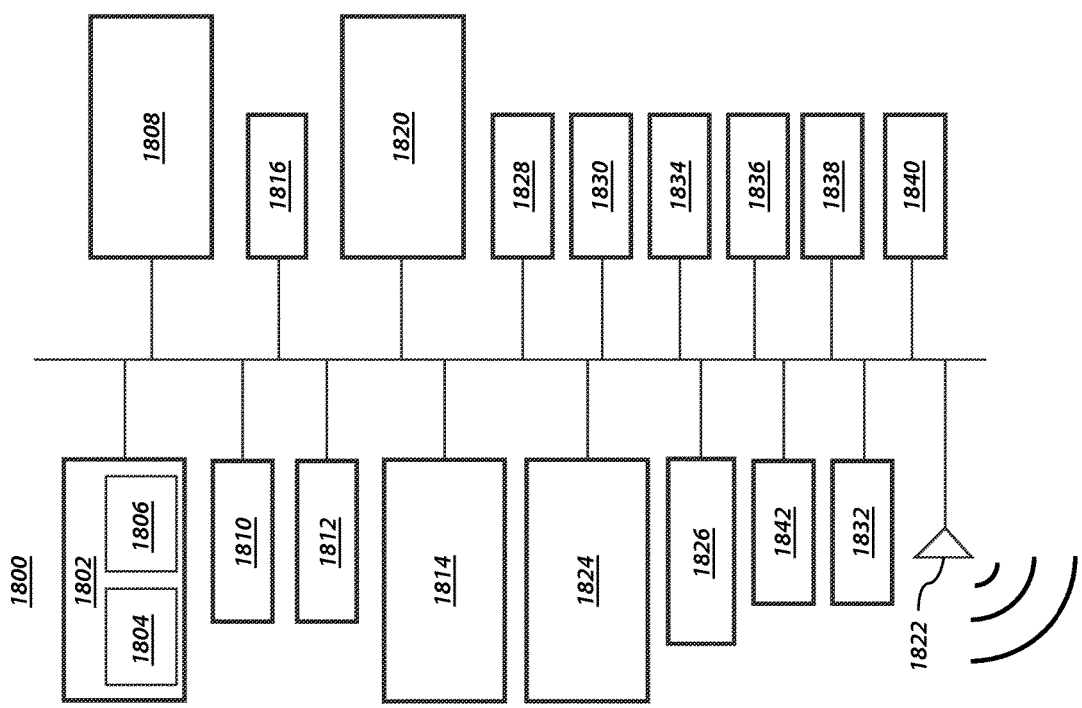

TECHNIQUES FOR FILAMENT LOCALIZATION, EDGE EFFECT REDUCTION, AND FORMING/SWITCHING VOLTAGE REDUCTION IN RRAM DEVICES

FIELD

Embodiments described herein generally relate to resistive random access memory (RRAM) devices and more particularly to techniques for localizing filaments within a RRAM device.

BACKGROUND

A RRAM device is a type of non-volatile random access memory computer memory that works by changing the resistance across a dielectric solid state material. During switching, the dielectric material, which is normally insulating, is made to conduct electrical current through a conduction path referred to as a filament. Conventional RRAM stacks are planar and therefore when a sufficiently high voltage is applied, an electric field is uniformly applied across the entire RRAM device.

As such, during switching, a filament can form randomly throughout the RRAM device. For example, in conventional RRAM devices, a filament may be formed near the edge of the device which may not provide a sufficient conductive path due to defects at the edge. In some instances, multiple deficient filaments may form randomly within the RRAM device. As such, there exists a need to provide a technique to form a localized filament within a RRAM device. The present disclosure addresses this need.

BRIEF DESCRIPTION OF THE DRAWINGS

FIGS. 6A-6H are process flow schematics for a RRAM device structure in accordance with an embodiment of the present disclosure.

FIG. 7 is an exemplary RRAM device structure which includes an oxygen exchange layer in accordance with an embodiment of the present disclosure.

FIG. 8 is another RRAM device structure which includes an oxygen exchange layer in accordance with yet another embodiment of the present disclosure.

FIG. 9 is yet another RRAM device structure which includes an oxygen exchange layer in accordance with an embodiment of the present disclosure.

FIG. 10 is a fourth RRAM device structure which includes an oxygen exchange layer in accordance with an embodiment of the present disclosure.

FIG. 11 is a fifth RRAM device structure which includes an oxygen exchange layer in accordance with an embodiment of the present disclosure.

FIG. 12 is a sixth RRAM device structure which includes an oxygen exchange layer in accordance with an embodiment of the present disclosure.

FIG. 17 is an interposer implementing one or more embodiments of the present disclosure.

FIG. 18 is a computing device built in accordance with an embodiment of the present disclosure.

DETAILED DESCRIPTION

Described herein are systems and methods of random resistive access memory devices, and in particular (but not exclusively), to RRAM devices which implement techniques for filament localization and forming/switching voltage reduction. In the following description, various aspects of the illustrative implementations will be described using terms commonly employed by those skilled in the art to convey the substance of their work to others skilled in the art. However, it will be apparent to those skilled in the art that the present disclosure may be practiced with only some of the described aspects. For purposes of explanation, specific numbers, materials and configurations are set forth in order to provide a thorough understanding of the illustrative implementations. However, it will be apparent to one skilled in the art that the present disclosure may be practiced without the specific details. In other instances, well-known features are omitted or simplified in order not to obscure the illustrative implementations.

Various operations will be described as multiple discrete operations, in turn, in a manner that is most helpful in understanding the present disclosure, however, the order of description should not be construed to imply that these operations are necessarily order dependent. In particular, these operations need not be performed in the order of presentation.

Implementations of the disclosure may be formed or carried out on a substrate, such as a semiconductor substrate. In one implementation, the semiconductor substrate may be a crystalline substrate formed using a bulk silicon or a silicon-on-insulator substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V or group IV materials. Although a few examples of materials from which the substrate may be formed are described here, any material that may serve as a foundation upon which a semiconductor device may be built falls within the spirit and scope of the present disclosure.

Figure 1:
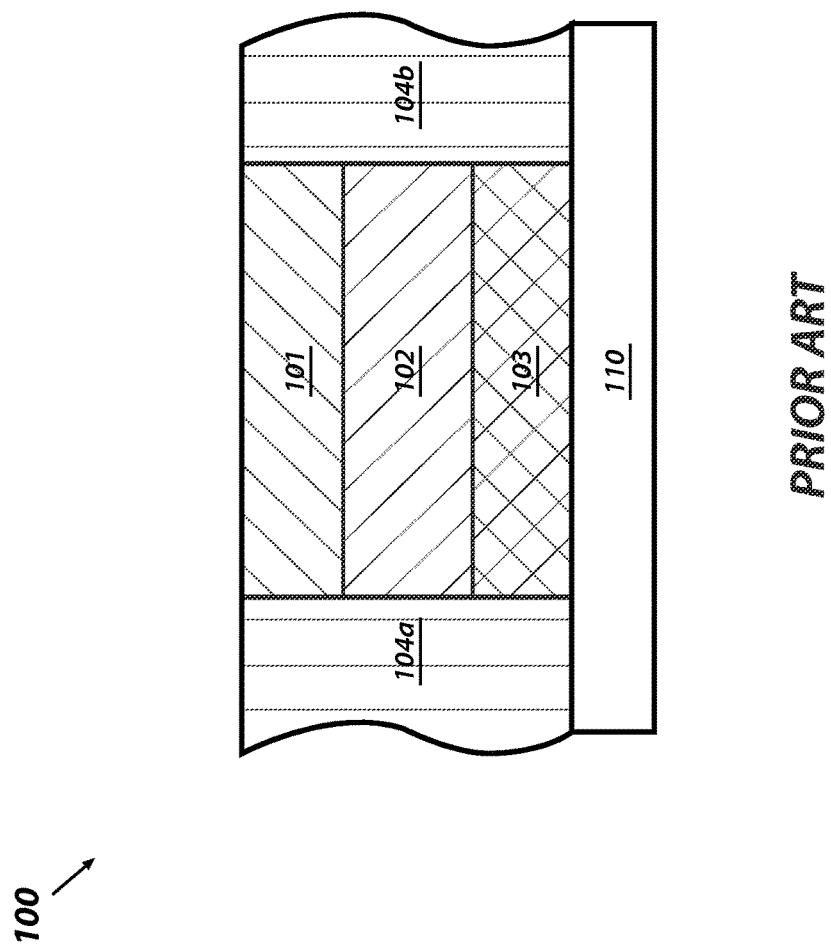
FIG. 1 is a conventional RRAM device structure known in the art.

FIG. 1 is a conventional resistive random access memory (RRAM) device 100 structure known in the art. RRAM device 100 includes a top and bottom electrode 101, 103 disposed on opposing sides of a RRAM dielectric material 102. On lateral sides of the top electrode 101, RRAM dielectric material 102, and bottom electrode 103 are interlayer dielectric (ILD) regions 104a, 104b. Accordingly, the RRAM device 100 structure is a stack of metal and dielectric materials disposed on a substrate 110.

Top and bottom electrodes 101, 103 may be composed of a metal material. For example, top and bottom electrodes 101, 103 may be composed of titanium nitride (TiN) but are not limited thereto. In some embodiments, top and bottom electrodes 101, 103 may also include tungsten (W).

RRAM dielectric material 102 may include an oxide material. For example, RRAM dielectric material 102 may comprise titanium oxide (TiOx), hafnium oxide (HfOx), tantalum oxide (TaOx), or tungsten oxide (WOx).

Figure 2:
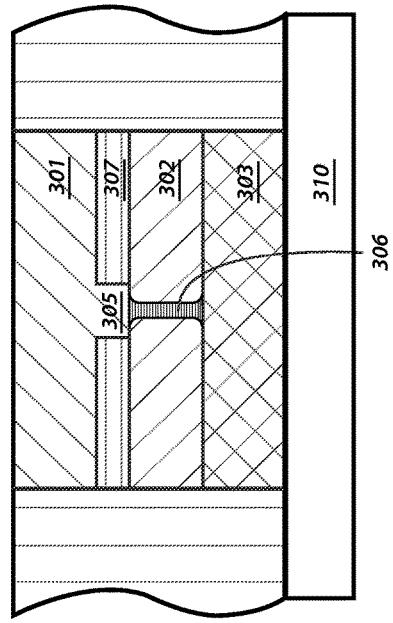
FIG. 2 is an exemplary RRAM device structure in accordance with an embodiment of the present disclosure.

FIG. 2 is an exemplary RRAM device structure 200 in accordance with an embodiment of the present disclosure. RRAM device structure 200 comprises a stack of material layers on a substrate 210. RRAM device structure 200 comprises a top electrode 201, bottom electrode 203, RRAM dielectric material 202, and a pair of lateral ILD regions 204a, 204b. Most notably, RRAM dielectric material 202 includes a recess 205 portion. In some embodiments, the recess 205 portion of RRAM dielectric material 202 is adjacent to top electrode 201.

Advantageously, recess 205 portion facilitates filament localization. In some embodiments, recess 205 is near the center of the RRAM dielectric material 202 and away from the edges of the RRAM dielectric material/ILD interface. As such, when a threshold voltage is applied to effect switching, a filament 206 forms extending from the recess 205 portion to the bottom electrode such that an electrical pathway extends from the top electrode 201 to the bottom electrode 203. In some implementations, the filament 206 area consists of oxygen vacancies as oxygen atoms have been removed by techniques described below. Most notably, the electric field generated by the applied threshold is approximately twice as great as the electric field in the dielectric material 202 external to the recess 205 portion according to some embodiments of the present disclosure.

In some embodiments, the threshold voltage needed to effect switching may range from 0.5-3 volts. However, the present disclosure is not limited thereto. In some embodiments, the threshold voltage to effect switching is 3 volts for a 4 nm-thick RRAM dielectric material 202.

In the embodiment shown in the figure, recess 205 portion has a square profile. However, as will be described below, the recess 205 portion is not limited thereto. The recess 205 portion may be formed by any conventional semiconductor process known in the art. For example, a subtractive process such as an etch process may be used to form the recess 205 portion as will be further described below. The depth of the recess 205 portion may range from 0.5 nm-10 nm. In some embodiments, the depth of the recess 205 portion is 2.0 nm. It should be understood by one having ordinary skill in the art that the dimensions of the recess 205 portion may depend on the material properties of the RRAM dielectric material 202.

The other layers of the RRAM device structure 200 may also be defined with regards to dimensions. The RRAM dielectric material 202 may have a thickness between 1 nm and 9 nm. For example, the thickness of RRAM dielectric material 202 is 4 nm. In an embodiment when the RRAM dielectric material 202 has a thickness of 4 nm, the thickness of the recess 205 portion is approximately 2 nm. In yet another embodiment, when the RRAM dielectric material 202 has a thickness of 8 nm, the thickness of the recess 205 portion is approximately 2 nm.

The top and bottom electrodes 201, 203 may have a thickness between 10 nm and 100 nm each. In some embodiments, the thickness of the top electrode 201 and the bottom electrode 203 is approximately 30 nm. The ILD regions 204a, 204b may have a thickness between 50 nm and 150 nm.

Figure 3:
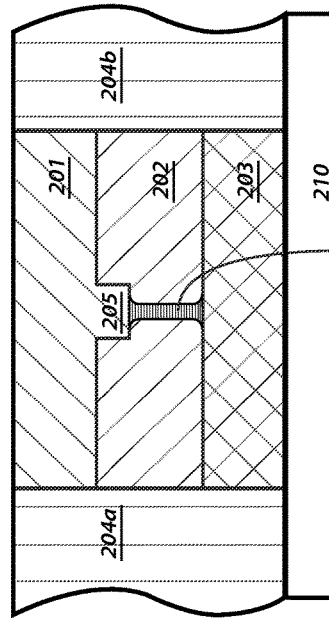
FIG. 3 is another RRAM device structure in accordance with an embodiment of the present disclosure.

FIG. 3 is another RRAM device structure 300 in accordance with an embodiment of the present disclosure. RRAM device structure 300 includes an additional layer 307 disposed upon the top surface of RRAM dielectric material 302 which are both disposed between a top and bottom electrode 301, 303 and formed upon a substrate 310. In some embodiments, the additional layer 307 is a dielectric material such as an oxide layer. Most notably, layer 307 has a recess 305 there through. The thickness of layer 307 may be between 0.5 nm and 10 nm. As such, recess 305 which is provided by layer 307 enables filament 306 localization when a threshold voltage is applied to the device structure 300. In the embodiment shown, recess 305 has a square profile.

Figure 4:
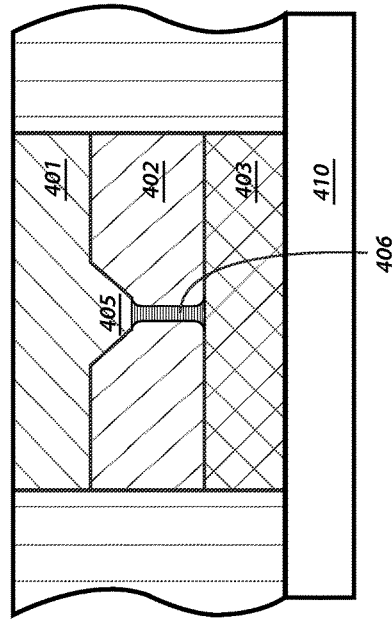
FIG. 4 is yet another RRAM device structure in accordance with an embodiment of the present disclosure.

FIG. 4 is yet another RRAM device structure 400 in accordance with an embodiment of the present disclosure. RRAM device structure 400 is similar to but distinguishable from the RRAM device structure 200 in FIG. 2. In particular, RRAM device structure 400 has a v-shape recess 405 profile. Notably, the v-shaped recess 400 is formed within the RRAM dielectric material such that during switching, a conductive path extends from top electrode 401 to bottom electrode 403 through filament 406.

Figure 5:
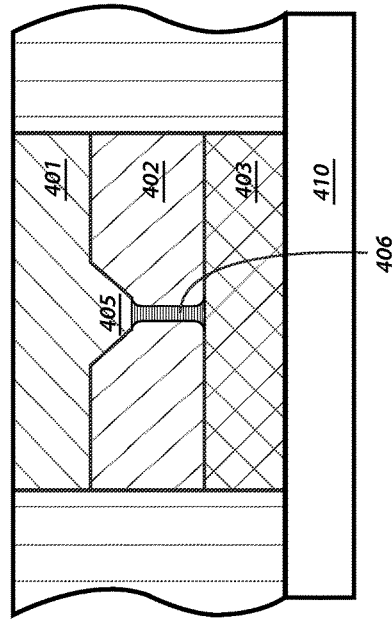
FIG. 5 is a fourth exemplary RRAM device structure in accordance with an embodiment of the present disclosure.

FIG. 5 is a fourth exemplary RRAM device structure 500 in accordance with an embodiment of the present disclosure. RRAM device structure 500 is similar to but distinguishable from the RRAM device structure 300 in FIG. 3. In particular, RRAM device structure 500 has an additional layer 507 which may consist of a dielectric material. Notably, a v-shaped recess 505 profile may be formed within the additional layer 507 such that during switching, a conductive path extends from top electrode 501 to bottom electrode 503 through filament 506.

FIGS. 6A-6H are process flow schematics for a RRAM device structure in accordance with an embodiment of the present disclosure. It should be understood by one having ordinary skill in the art that the process techniques described below are exemplary and by no way limit the present disclosure. Accordingly, alternative process techniques may be used so long as the resulting RRAM device structure has the performance properties as described herein.

In FIG. 6A, the structure includes a substrate 610 with a bottom electrode 603, ILD regions 604a, 604b, and RRAM dielectric material 602. The bottom electrode 603 may be formed by any suitable process such as a physical vapor deposition (PVD) process. In the embodiment where a PVD process is employed, the deposition rate for forming the bottom electrode 603 may be between 1 A/sec and 100 A/sec. The bottom electrode 603 may consist of titanium or tungsten. ILD regions 604a, 604b may be formed by any suitable techniques known in the art such as, but not limited to, a chemical vapor deposition (CVD) process.

RRAM dielectric material 602 may be formed by a PVD or an atomic layer deposition (ALD) process. In an embodiment when a PVD process is employed, a RRAM dielectric material 602 may be deposited at a rate between 1 and 20 angstroms/second. Alternatively, when an ALD process is used, a RRAM dielectric material 602 may be deposited at a rate between 1 angstrom/(10 seconds) and 1 angstrom/(60 seconds). Various materials may be used for the RRAM dielectric material 602 such as hafnium oxide (HfOx), titanium oxide (TiOx), tantalum oxide (TaOx), or tungsten oxide (WOx).

FIG. 6B illustrates the start of the process for creating a recess portion within the RRAM dielectric material 602. In the embodiment shown, a hardmask layer, which may be patterned into hardmask regions 607a, 607b by various process methods known in the art, may be formed on top of the RRAM dielectric material 602. Next, spacer materials 608 may be formed between the hardmask regions 607a, 607b.

FIG. 6C illustrates the result of a subtractive process, such as an etch, to form a recess 605 in the RRAM dielectric material 602. In some implementations, patterning may also be accompanied with the subtractive process to form the recess.

In some embodiments, the recess portion 605 may have two regions with one region wider than the other. FIG. 6D illustrates additional spacer 609 material within the recess 605 to form a second region therein. By any suitable methods known in the art, the spacer 609 material may be patterned. In some implementations, patterning may also be accompanied with the subtractive process to form the recess.

Moving forward to FIG. 6E, a subtractive process may be used to form the second region such that recess 605 has a first recess portion 605a and a second recess portion 605b.

After the recess 605 is formed, the material used to form a top electrode is formed over the recess 605. A top electrode may be formed by a PVD process and the top electrode 605 material may be deposited at a rate between 1 angstrom/second and 100 angstroms/second. FIG. 6F illustrates the result of a top electrode 601 formed over the RRAM dielectric material 602 having the recess portions 605a, 605b therein. Top electrode 601 may consist of titanium or tungsten.

FIG. 6G illustrates portions of the RRAM device stack etched to expose the ILD regions 604a, 604b. After the ILD regions 604a, 604b are exposed, a deposition process (e.g., CVD) is used to increase the height of the ILD layer such that a planar RRAM device stack results (see FIG. 6H).

The temperature employed within the process chamber during a PVD or ALD deposition process may be between 30° C. and 500° C. The pressure employed during the PVD deposition process may be between 0.5 and 10 mTorr whereas during the ALD deposition process, the pressure employed within the process chamber may be between 1 and 200 Torr.

FIG. 7 is an exemplary RRAM device structure 700 which includes a top electrode 701, RRAM dielectric material 702, bottom electrode 703, in addition to an oxygen exchange layer 711 which are all disposed on a substrate 710 in accordance with an embodiment of the present disclosure.

In some embodiments, oxygen exchange layer 711 may create oxygen vacancies within the RRAM dielectric material 702 which may aid in the forming of a conductive path during the switching process. In addition, the recess 705 within the RRAM dielectric material 702 may localize a filament near the recess 705 (e.g., near the center of the stack). As such, the presence of oxygen exchange layer 711 may help to reduce the forming/switching voltage for the RRAM device structure 700.

Oxygen exchange layer 711 may comprise any of various materials such as, but not limited to, hafnium, titanium, tantalum, platinum, or palladium. The oxygen exchange layer 711 may be formed by any suitable process such as a PVD process with a deposition rate between 1 and 100 A/sec.

FIG. 8 is another RRAM device structure 800 which includes an oxygen exchange layer 811 in accordance with an embodiment of the present disclosure. Similar to the RRAM device structure 700 illustrated in FIG. 7, RRAM device includes a top electrode 801, bottom electrode 803, and RRAM dielectric material regions 802a, 802b. A recess portion 805 is formed within RRAM dielectric material region 802b. The layers of RRAM device structure 800 previously described are disposed on a substrate 810. Notably, the oxygen exchange layer 811 is adjacent to the recess portion 805 of the additional dielectric material 802 and the RRAM dielectric material 802.

FIG. 9 is yet another RRAM device structure 900 which includes an oxygen exchange layer 911 in accordance with an embodiment of the present disclosure. Likewise, RRAM device structure 900 also includes a top electrode 901, bottom electrode 903, RRAM dielectric material 902 with recess portion 905 all disposed on substrate 910. Most notably, oxygen exchange layer 911 is disposed on a top surface of RRAM dielectric material 902 and within recess portion 905. In particular, oxygen exchange layer 911 is disposed between top electrode 901 and RRAM dielectric material 902.

FIG. 10 is a fourth RRAM device structure 1000 which includes an oxygen exchange layer 1011 in accordance with an embodiment of the present disclosure. Likewise, the layers within the RRAM device structure 1000 as described above are all disposed on a substrate 1010. As illustrated, the RRAM device structure 1000 has an oxygen exchange layer 1011 disposed beneath the RRAM dielectric material 1002. Notably, a recess portion 1005 is formed within the additional dielectric layer 1007.

FIG. 11 is a fifth RRAM device structure 1100 which includes an oxygen exchange layer 1111 in accordance with an embodiment of the present disclosure. Likewise, the layers within the RRAM device structure 1100 as described above are all disposed on a substrate 1110. The oxygen exchange layer 1111 is disposed between the RRAM dielectric material 1102 and the additional dielectric material 1107 having a recess portion 1105 therein.

FIG. 12 is a sixth RRAM device structure 1200 which includes an oxygen exchange layer 1211 in accordance with an embodiment of the present disclosure. RRAM device structure 1200 includes electrodes and an oxygen exchange layer 1211 disposed on an additional dielectric material 1207 having a recess portion 1205 therein. Accordingly, during a switching process, a filament may be formed within the RRAM dielectric material under the recess portion 1205 of the additional dielectric material 1207.

Figure 13:
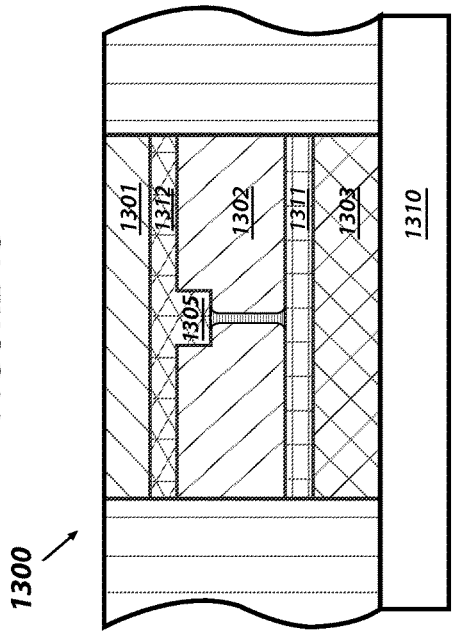
FIG. 13 is an exemplary RRAM device structure with an oxygen exchange layer and a metal layer disposed on opposing sides of a RRAM dielectric layer in accordance with an embodiment of the present disclosure.

FIG. 13 is an exemplary RRAM device structure 1300 having an oxygen exchange layer 1311 and a metal layer 1312 disposed on opposing sides of a RRAM dielectric material 1302. In the embodiment shown, a recess 1305 is disposed within the RRAM dielectric material 1302 and is filled with a metal material (i.e., metal layer 1312). During a heating process, metal atoms from metal layer 1312 may diffuse into RRAM dielectric material 1302. As such, the metal layer 1312 can be used to make the filament formed within the RRAM dielectric material 1302 more conductive during the switching process thereby reducing the switching voltage. As described above, RRAM device structure 1300 includes top and bottom electrodes 1301, 1303 and other material layers disposed over substrate 1310.

Figure 14:
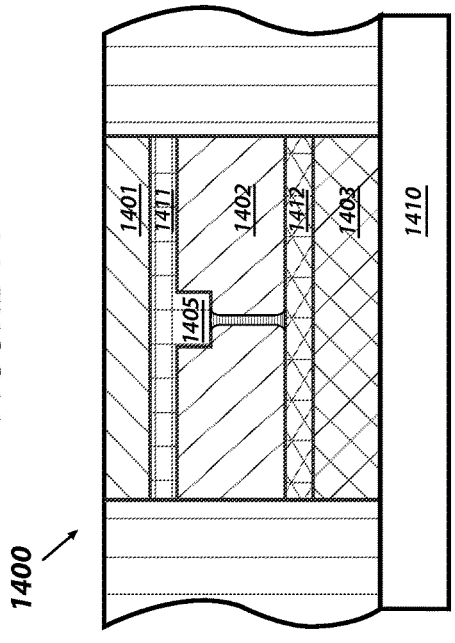
FIG. 14 is another exemplary RRAM device structure with an oxygen exchange layer and a metal layer disposed on opposing sides of a RRAM dielectric layer in accordance with an embodiment of the present disclosure.

FIG. 14 is another RRAM device structure 1400 with an oxygen exchange layer 1411 and a metal layer 1412 disposed on opposing sides of a RRAM dielectric layer 1402 in accordance with an embodiment of the present disclosure. In the embodiment shown, the oxygen exchange layer 1411 is formed within the recess 1405 of RRAM dielectric layer 1402. As described above, RRAM device structure 1400 includes top and bottom electrodes 1401, 1403 and other material layers disposed over substrate 1410.

Figure 15:
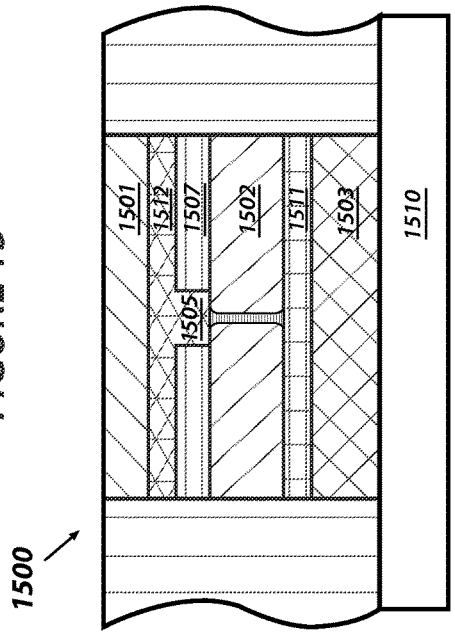
FIG. 15 is yet another RRAM device structure with an oxygen exchange layer and a metal layer disposed on opposing sides of a RRAM dielectric layer in accordance with an embodiment of the present disclosure.

FIG. 15 is yet another RRAM device structure 1500 with an oxygen exchange layer 1511 and a metal layer 1512 disposed on opposing sides of a RRAM dielectric layer 1502 in accordance with an embodiment of the present disclosure. In particular, the oxygen exchange layer 1511 is disposed beneath RRAM dielectric layer 1502 whereas metal layer 1512 is disposed over the RRAM dielectric layer 1502. In the embodiment shown, the RRAM device structure 1500 includes an additional layer 1507 with a recess 1505 filled with the metal layer 1512 material. RRAM device structure 1500 includes top and bottom electrodes 1501, 1503, and other material layers disposed over substrate 1510.

Figure 16:
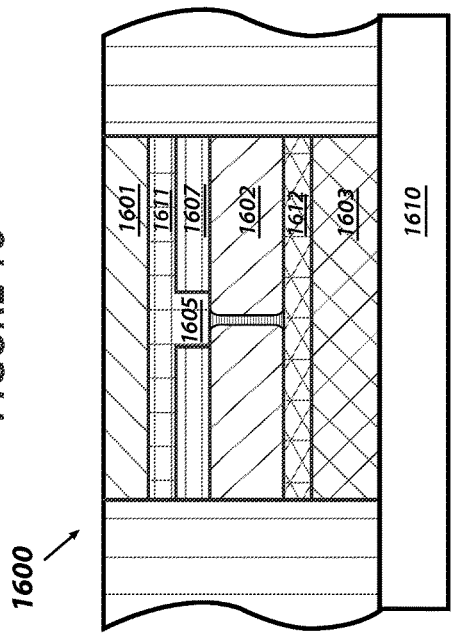
FIG. 16 is a fourth exemplary RRAM device structure with an oxygen exchange layer and a metal layer disposed on opposing sides of a RRAM dielectric layer in accordance with an embodiment of the present disclosure.

FIG. 16 is a fourth exemplary RRAM device structure 1600 with an oxygen exchange layer 1611 and a metal layer 1612 disposed on opposing sides of a RRAM dielectric layer 1602 in accordance with an embodiment of the present disclosure. In the embodiment shown, the oxygen exchange layer is disposed above the RRAM dielectric layer 1602 whereas metal layer 1612 is disposed beneath RRAM dielectric layer 1602. Notably, the oxygen exchange layer 1611 is disposed within recess 1605. RRAM device structure 1600 includes top and bottom electrodes 1601, 1603, and other material layers disposed over substrate 1610.

FIG. 17 illustrates an interposer 1700 that includes one or more embodiments of the present disclosure. The interposer 1700 is an intervening substrate used to bridge a first substrate 1702 to a second substrate 1704. The first substrate 1702 may be, for instance, an integrated circuit die. The second substrate 1704 may be, for instance, a memory module, a computer motherboard, or another integrated circuit die. Generally, the purpose of an interposer 1700 is to spread a connection to a wider pitch or to reroute a connection to a different connection. For example, an interposer 1700 may couple an integrated circuit die to a ball grid array (BGA) 1706 that can subsequently be coupled to the second substrate 1704. In some embodiments, the first and second substrates 1702/1704 are attached to opposing sides of the interposer 1700. In other embodiments, the first and second substrates 1702/1704 are attached to the same side of the interposer 1700. And in further embodiments, three or more substrates are interconnected by way of the interposer 1700.

The interposer 1700 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer may include metal interconnects 1708 and vias 1710, including but not limited to through-silicon vias (TSVs) 1712. The interposer 1700 may further include embedded devices 1714, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 1700.

In accordance with embodiments of the present disclosure, apparatuses or processes disclosed herein may be used in the fabrication of interposer 1700.

FIG. 18 illustrates a computing device 1800 in accordance with one embodiment of the present disclosure. The computing device 1800 may include a number of components. In one embodiment, these components are attached to one or more motherboards. In an alternate embodiment, these components are fabricated onto a single system-on-a-chip (SoC) die rather than a motherboard. The components in the computing device 1800 include, but are not limited to, an integrated circuit die 1802 and at least one communication chip 1808. In some implementations the communication chip 1808 is fabricated as part of the integrated circuit die 1802. The integrated circuit die 1802 may include a CPU 1804 as well as on-die memory 1806, often used as cache memory, that can be provided by technologies such as embedded DRAM (eDRAM) or spin-transfer torque memory (STTM or STTM-RAM).

Computing device 1800 may include other components that may or may not be physically and electrically coupled to the motherboard or fabricated within an SoC die. These other components include, but are not limited to, volatile memory 1810 (e.g., DRAM), non-volatile memory 1812 (e.g., ROM or flash memory), a graphics processing unit 1814 (GPU), a digital signal processor 1816, a crypto processor 1842 (a specialized processor that executes cryptographic algorithms within hardware), a chipset 1820, an antenna 1822, a display or a touchscreen display 1824, a touchscreen controller 1826, a battery 1830 or other power source, a power amplifier (not shown), a global positioning system (GPS) device 1828, a compass 1830, a motion coprocessor or sensors 1832 (that may include an accelerometer, a gyroscope, and a compass), a speaker 1834, a camera 1836, user input devices 1838 (such as a keyboard, mouse, stylus, and touchpad), and a mass storage device 1840 (such as hard disk drive, compact disk (CD), digital versatile disk (DVD), and so forth).

The communications chip 1808 enables wireless communications for the transfer of data to and from the computing device 1800. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1808 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 1800 may include a plurality of communication chips 1808. For instance, a first communication chip 1808 may be dedicated to shorter range wireless communications such as Wi-Fi and Bluetooth and a second communication chip 1808 may be dedicated to longer range wireless communications such as GPS, EDGE, GPRS, CDMA, WiMAX, LTE, Ev-DO, and others.

The processor 1804 of the computing device 1800 includes one or more devices, such as RRAM devices, that are formed in accordance with embodiments of the present disclosure. The term "processor" may refer to any device or portion of a device that processes electronic data from registers and/or memory to transform that electronic data into other electronic data that may be stored in registers and/or memory.

The communication chip 1808 may also include one or more devices such as RRAM devices that are formed in accordance with embodiments of the present disclosure.

In further embodiments, another component housed within the computing device 1800 may contain one or more devices, such as RRAM devices, that are formed in accordance with implementations of the present disclosure.

In various embodiments, the computing device 1800 may be a laptop computer, a netbook computer, a notebook computer, an ultrabook computer, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 1800 may be any other electronic device that processes data.

The above description of illustrated implementations of the present disclosure, including what is described in the Abstract, is not intended to be exhaustive or to limit the present disclosure to the precise forms disclosed. While specific implementations of, and examples for, the present disclosure are described herein for illustrative purposes, various equivalent modifications are possible within the scope of the present disclosure, as those skilled in the relevant art will recognize.

These modifications may be made to the present disclosure in light of the above detailed description. The terms used in the following claims should not be construed to limit the present disclosure to the specific implementations disclosed in the specification and the claims. Rather, the scope of the present disclosure is to be determined entirely by the following claims, which are to be construed in accordance with established doctrines of claim interpretation.

The invention claimed is:

1. A method for forming a resistive random access memory device, comprising:
    forming a first electrode over a substrate;
    forming a dielectric region on lateral portions of the first electrode;
    forming a resistive random access memory oxide layer over the first electrode and the dielectric regions;
    forming a recess region in the resistive random access memory oxide layer;
    forming a second electrode over the resistive random access memory oxide layer wherein a portion of the second electrode fills the recess region;
    patterning the second electrode and the resistive random access memory oxide layer to expose the dielectric region on the lateral portions of the first electrode; and
    extending the dielectric region on the lateral portions of the first electrode to cover lateral portions of the resistive random access memory oxide layer and the second electrode.

2. The method of claim 1, wherein forming the recess region includes forming a first recess having a first area and forming a second recess having a second area wherein the first area is less than the second area.

3. The method of claim 2, wherein forming the recess region includes:
    forming a hardmask layer on the resistive random access memory oxide layer;
    forming an opening in the hardmask layer;
    forming a spacer material within the opening; and
    etching the recess region into the top center portion of resistive random access memory oxide layer;
    wherein etching the recess region forms the first recess.

4. The method of claim 3 further comprising etching a second recess within the recess region.

5. The method of claim 1 further comprising forming an oxygen exchange layer on the first electrode wherein the oxygen exchange layer is disposed between the first electrode and the resistive random access memory oxide layer.

6. The method of claim 1 further comprising forming a metal layer on the first electrode; wherein the metal layer is disposed between the first electrode and the resistive random access memory oxide.

* * * * *